(12) United States Patent
Hauenstein et al.

(10) Patent No.: US 8,350,376 B2
(45) Date of Patent: Jan. 8, 2013

(54) BONDWIRELESS POWER MODULE WITH THREE-DIMENSIONAL CURRENT ROUTING

(75) Inventors: Henning M. Hauenstein, Redondo Beach, CA (US); Andrea Gorgerino, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 81 days.

(21) Appl. No.: 13/088,573

(22) Filed: Apr. 18, 2011

(65) Prior Publication Data

US 2012/0262100 A1    Oct. 18, 2012

(51) Int. Cl.
*H01L 23/52* (2006.01)
*H01L 23/02* (2006.01)

(52) U.S. Cl. ........ 257/691; 257/685; 257/779; 257/704; 257/707; 257/E23.079; 257/E23.153; 257/E23.169

(58) Field of Classification Search ............ 257/691, 257/685, 779, 704, 707
See application file for complete search history.

(56) References Cited

U.S. PATENT DOCUMENTS

| | | | | |
|---|---|---|---|---|
| 5,202,578 A * | 4/1993 | Hideshima | ...................... | 257/685 |
| 6,396,127 B1 * | 5/2002 | Munoz et al. | ................... | 257/666 |
| 6,917,103 B2 * | 7/2005 | Hirano et al. | .................. | 257/707 |
| 7,554,188 B2 | 6/2009 | Hauenstein | | |
| 7,619,302 B2 | 11/2009 | Hauenstein | | |
| 7,781,882 B2 * | 8/2010 | Zhong et al. | ................... | 257/707 |
| 7,868,472 B2 * | 1/2011 | Kelly | ............................. | 257/796 |
| 8,227,907 B2 * | 7/2012 | Tomita et al. | .................. | 257/691 |
| 2007/0138651 A1 | 6/2007 | Hauenstein | | |
| 2007/0290311 A1 | 12/2007 | Hauenstein | | |
| 2009/0160044 A1 * | 6/2009 | Taniguchi et al. | ............. | 257/690 |

* cited by examiner

*Primary Examiner* — David Zarneke
(74) *Attorney, Agent, or Firm* — Farjami & Farjami LLP

(57) ABSTRACT

According to an exemplary embodiment, a bondwireless power module includes a common output pad coupling an emitter/anode node of a high side device to a collector/cathode node of a low side device. The bondwireless power module also includes a high side conductive clip connecting a collector of the high side device to a cathode of the high side device, and causing current to traverse through the high side conductive clip to another high side conductive clip in another power module. The bondwireless power module further includes a low side conductive clip connecting an emitter of the low side device to an anode of the low side device, and causing current to traverse through the low side conductive clip to another low side conductive clip in the another power module. The bondwireless power module can be a motor drive inverter module.

24 Claims, 4 Drawing Sheets

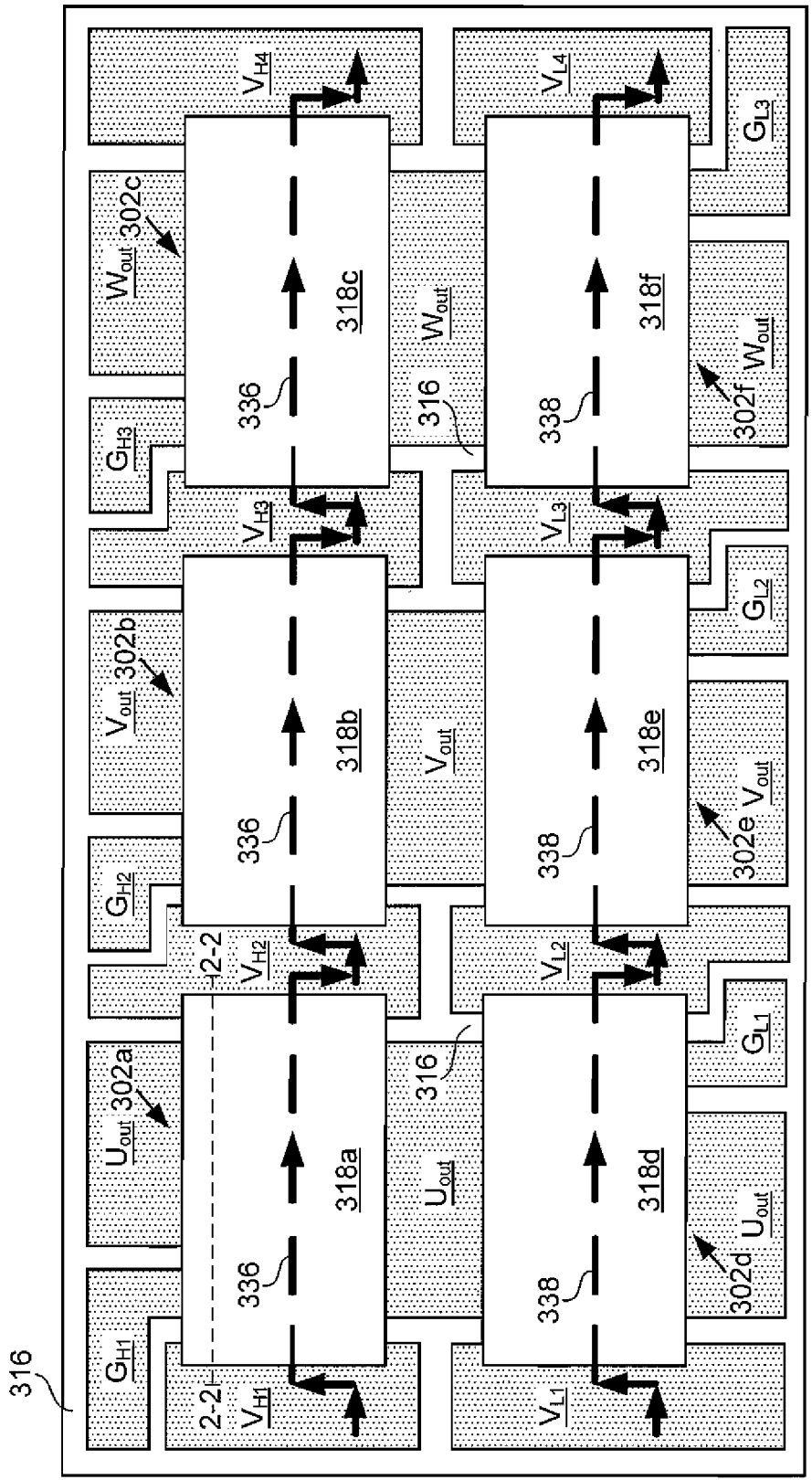

BONDWIRELESS POWER MODULE WITH THREE-DIMENSIONAL CURRENT ROUTING

BACKGROUND OF THE INVENTION

1. Field of the Invention

The present invention is generally in the field of semiconductors. More particularly, the invention relates to the packaging of semiconductor dies.

2. Background Art

A power module, such as a motor drive inverter, for example a three-phase inverter, can include at least one power switch that can be, for example, an insulated-gate bipolar transistor (IGBT) or a power metal-oxide-semiconductor field-effect transistor (MOSFET). As an example, an IGBT die can placed in the power module, and a diode die can be connected in parallel with the IGBT die as a freewheeling diode. Although the dies may be capable of high performance, performance of the motor drive inverter can be limited by how the dies are connected. For example, inductivity, electromagnetic interference (EMI), and parasitics are of great concern when connecting the motor drive inverter.

The motor drive inverter power module is typically formed by wire bonding the dies to conductive traces on a substrate of the power module to connect the dies. The design and layout of the motor drive inverter can be complex as the motor drive inverter may include many dies. For example, a three-phase motor drive inverter can include three IGBT dies as high side power switches, another three IGBT dies as low side power switches, and corresponding diode dies as freewheeling diodes for each IGBT die. As such, the conductive traces must often follow long routing paths on the substrate of the power module, and can have undesirably asymmetric current paths with high inductivity. Also, it can be difficult to make the conductive traces sufficiently wide due to the long routing paths required to connect the dies. Thus, performance of the motor drive inverter can suffer. Furthermore, the motor drive inverter may have a large footprint and poor power density.

Thus, there is a need in the art for the capability to form an improved power module, such as an improved motor drive inverter, while overcoming the drawbacks and deficiencies in the art.

SUMMARY OF THE INVENTION

A bondwireless power module with three-dimensional current routing, substantially as shown in and/or described in connection with at least one of the figures, and as set forth more completely in the claims.

BRIEF DESCRIPTION OF THE DRAWINGS

FIG. 3A shows a top view of a bondwireless three-phase motor drive power module, in accordance with an embodiment of the present invention.

DETAILED DESCRIPTION OF THE INVENTION

The present invention is directed to a bondwireless power module with three-dimensional current routing. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
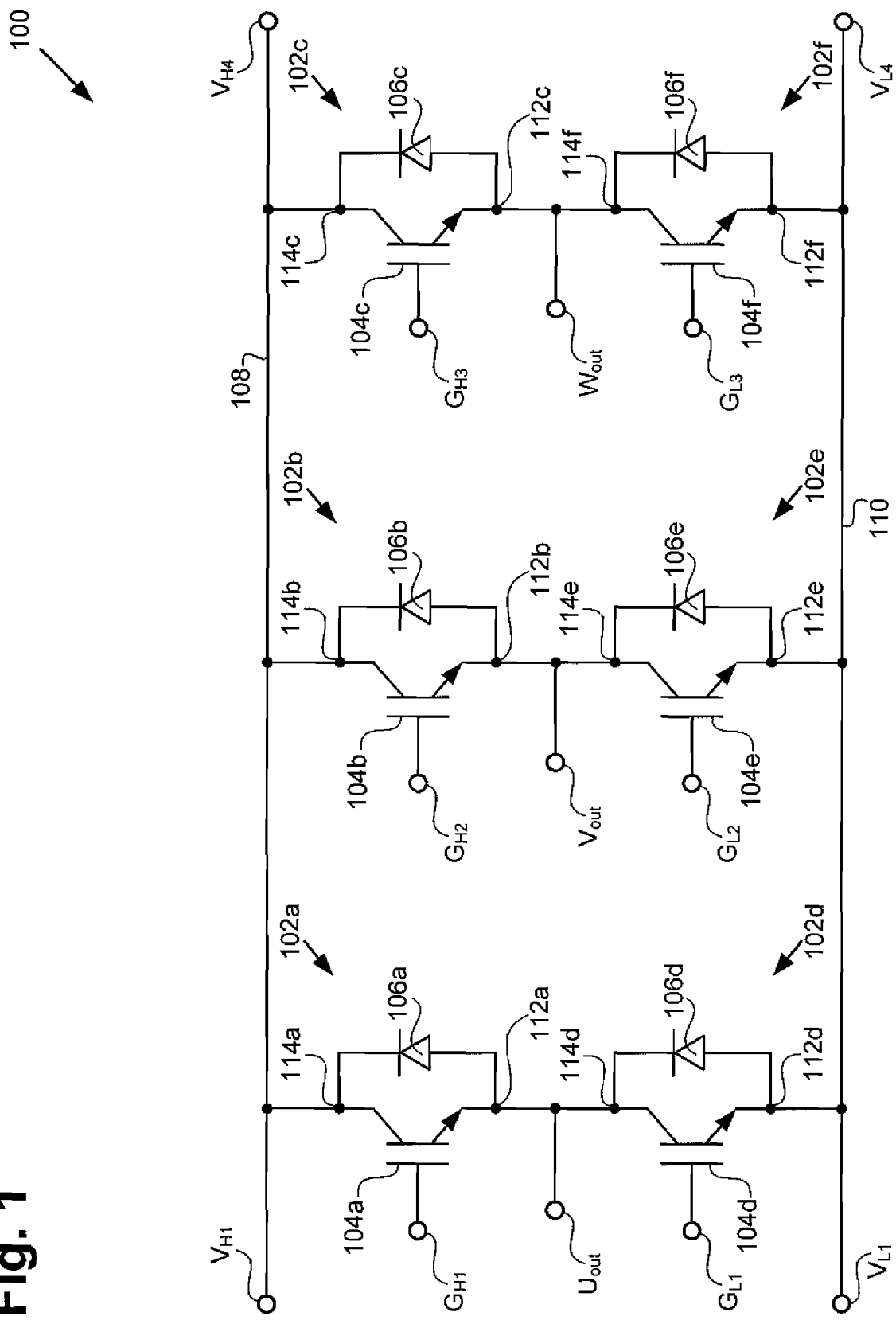
FIG. 1 shows an exemplary schematic of a three-phase motor drive inverter circuit, according to one embodiment of the invention.

FIG. 1 shows an exemplary schematic of three-phase motor drive inverter 100 (also referred to simply as a "motor drive inverter" in the present application), according to one embodiment of the invention. Motor drive inverter 100 comprises high side devices 102a, 102b, and 102c and low side devices 102d, 102e, and 102f, which are also referred to herein as devices, such as devices 102a-102f.

In the present embodiment, each of devices 102a-102f includes a freewheeling diode connected in parallel with a corresponding insulated-gate bipolar transistor (IGBT). For example, high side device 102a includes IGBT 104a and diode 106a, high side device 102b includes IGBT 104b and diode 106b, high side device 102c includes IGBT 104c and diode 106c, low side device 102d includes IGBT 104d and diode 106d, low side device 102e includes IGBT 104e and diode 106e, and low side device 102f includes IGBT 104f and diode 106f. Although devices 102a-102f each include an IGBT as a power switch, in some embodiments each of devices 102a-102f can include a different device, such as a power metal-oxide-semiconductor field-effect transistor (MOSFET). For example, in some embodiments a MOSFET replaces IGBT 104a and diode 106b can be a body diode of the MOSFET. Furthermore, in some embodiments devices 102a-102f may not include diodes 106a-106f or may include electrical components other than diodes 106a-106f.

Motor drive inverter 100 includes high side supply bus 108 and low side supply bus 110. High side supply bus 108 includes supply terminals $V_{H1}$ and $V_{H4}$ for connecting a high side supply voltage across high side supply bus 108. Low side supply bus 110 includes supply terminals $V_{L1}$ and $V_{L4}$ for connecting a low side supply voltage across low side supply bus 110.

In the present embodiment, motor drive inverter 100 is a three-phase motor drive inverter, which can be used to control a motor. In FIG. 1, a U phase of motor drive inverter 100 includes devices 102a and 102d connected in a half-bridge between high side supply bus 108 and, low side supply bus 110 with output terminal $U_{out}$ connected between devices 102a and 102d. Similarly, a V phase of motor drive inverter 100 includes devices 102b and 102e connected in a half-bridge between high side supply bus 108 and low side supply bus 110 with output terminal $V_{out}$ connected between devices 102b and 102e. Also, a W phase of motor drive inverter 100 includes devices 102c and 102f connected in a half-bridge between high side supply bus 108 and low side supply bus 110 with output terminal $W_{out}$ connected between devices 102c and 102f.

Motor drive inverter 100 also includes high side gate terminals $G_{H1}$, $G_{H2}$, and $G_{H3}$ and low side gate terminals $G_{L1}$, $G_{L2}$, and $G_{L3}$ (also referred to herein as gate terminals $G_{H1}$, $G_{H2}$, $G_{H3}$, $G_{L1}$, $G_{L2}$, and $G_{L3}$), which are each connected to a corresponding gate of one of IGBTs 102a-102f, as shown in FIG. 1. Gate terminals $G_{H1}$, $G_{H2}$, $G_{H3}$, $G_{L1}$, $G_{L2}$, and $G_{L3}$ can be used to selectively enable and disable IGBTs 102a-102f, as is known in the art.

FIG. 1 shows collector/cathode nodes 114a, 114b, 114c, 114d, 114e, and 114f and emitter/anode nodes 112a, 112b, 112c, 112d, 112e, and 112f. Collector/cathode nodes 114a, 114b, and 114c are each connected to high side supply bus 108 and emitter/anode nodes 112d, 112e, and 112f are each connected to low side supply bus 110. Also shown in FIG. 1, emitter/anode node 112a is connected to collector/cathode node 114d, emitter/anode node 112b is connected to collector/cathode node 114e, and emitter/anode node 112c is connected to collector/cathode node 114f.

Although the present embodiment is a three-phase motor drive inverter, other embodiments can include more or fewer phases. Furthermore, in some embodiments three-phase inverter 100 can be a circuit other than a motor drive inverter.

Motor drive inverter 100 can conventionally be implemented by electrically connecting dies over a substrate. For example, IGBTs 102a-102f and diodes 106a-106f can each be included in a respective die for a total of twelve discrete dies. Although the dies may be capable of high performance, performance of motor drive inverter 100 can be limited by how the dies are connected. In a conventional approach, motor drive inverter 100 is formed by wire bonding the dies to conductive traces formed on a substrate to connect the dies. Thus, conventional approaches utilize current routing in essentially two-dimensions on the substrate. However, using conventional approaches, the design and layout of motor drive inverter 100 is complex as motor drive inverter 100 may include, many dies, as well as numerous connections to and between the dies, as shown in FIG. 1. As such, the conductive traces must follow long routing paths on the substrate and may have undesirably asymmetric current paths as well as high inductivity. Also, it can be difficult to make the conductive traces sufficiently wide due to routing of the many conductive traces on the substrate. Thus, using conventional approaches, motor drive inverter 100 can have poor performance as well as a large footprint and poor power density.

Figure 2:
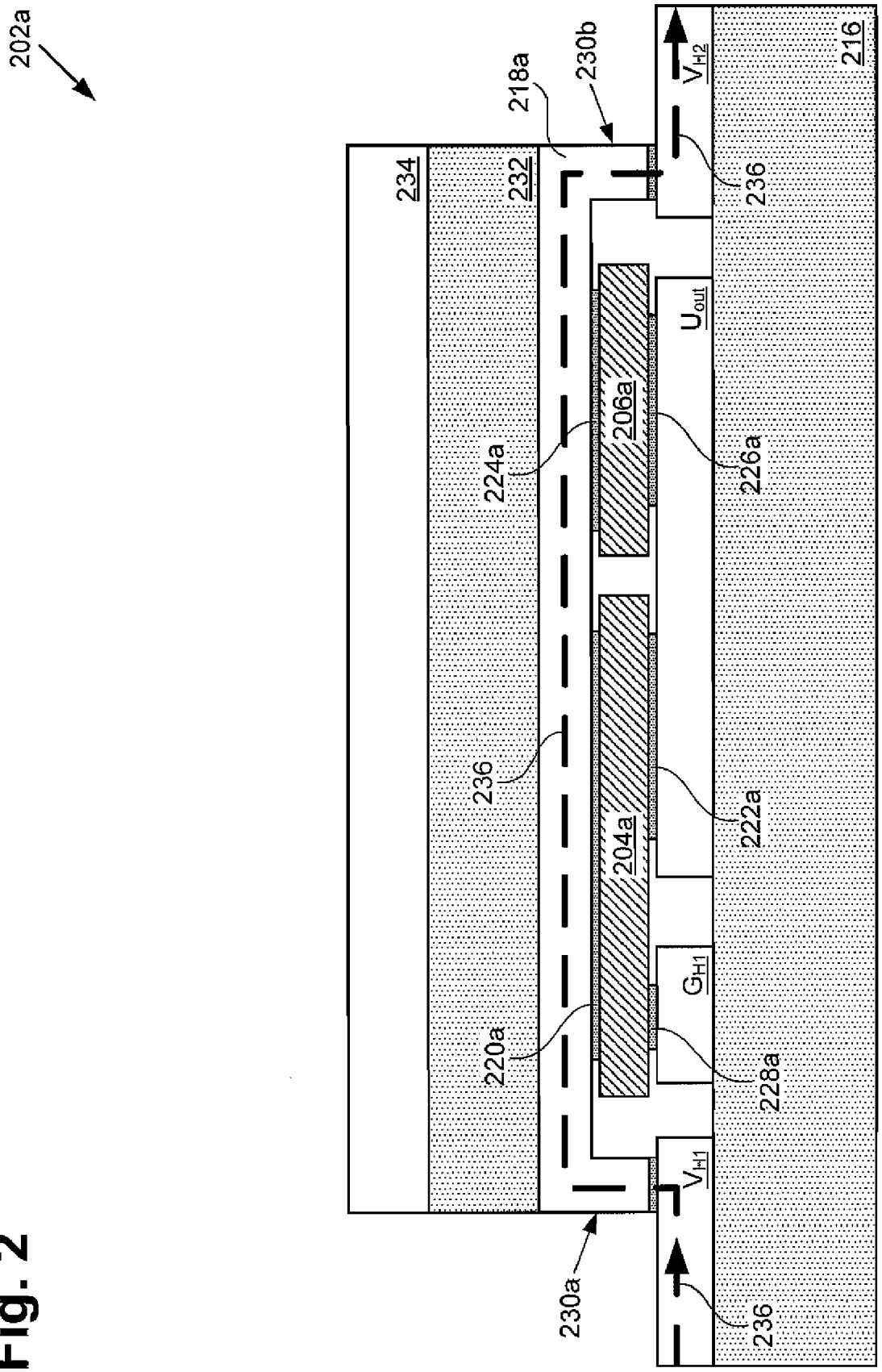
FIG. 2 illustrates a cross-sectional view of an exemplary high side device over a substrate used in a three-phase motor drive power module, according to one embodiment of the present invention.

Referring now to FIG. 2, FIG. 2 illustrates a cross-sectional view of exemplary high side device 202a over substrate 216, according to one embodiment of the present invention. In FIG. 2, high side device 202a corresponds to high side device 102a in FIG. 1. High side device 202a includes IGBT die 204a and diode die 206a corresponding respectively to IGBT 104a and diode 106a in FIG. 1. High side device 202a also includes high side conductive clip 218a (also referred to herein as conductive clip 218a).

FIG. 2 shows high side device 202a over substrate 216 and high side supply pads $V_{H1}$ and $V_{H2}$, high side gate pad $G_{H1}$, and common output pad $U_{out}$ situated on substrate 216. High side supply pads $V_{H1}$ and $V_{H2}$, high side gate pad $G_{H1}$, and common output pad $U_{out}$ each comprise conductive material, such as copper. In the present embodiment, high side supply pads $V_{H1}$ and $V_{H2}$, high side gate pad $G_{H1}$, and common output pad $U_{out}$ comprise conductive pads of a direct bonded copper (DBC) substrate. Substrate 216 can comprise for example, ceramic, or other substrate materials. Also, in some embodiments insulating material 232 and conductive material 234 can be included over conductive clip 218a. For example, insulating material 232 can comprise ceramic, and conductive material 234 can comprise copper bonded to insulating material 232. Thus, IGBT die 204a and diode die 206a can be cooled from both the top and bottom surfaces thereof. It is noted that some embodiments may not include insulating material 232 and conductive material 234.

In FIG. 2, IGBT die 204a is connected in parallel with diode die 206a. Conductive clip 218a connects collector 220a of high side device 202a to cathode 224a of high side device 202a. In the present embodiment, conductive clip 218a is electrically connected to collector 220a through a top surface of IGBT die 204a and is electrically connected to cathode 224a through a top surface of diode die 206a. Conductive clip 218a can comprise metal, such as copper, or other conductive material and is part of a high side supply bus corresponding to high side supply bus 108 in FIG. 1. Common output pad $U_{out}$ electrically connects emitter 222a of high side device 202a and anode 226a of high side device 202a. Common output pad $U_{out}$ is electrically connected to emitter 202a through a bottom surface of IGBT die 204a and is electrically connected to anode 226a through a bottom surface of diode die 206a. Thus, common output pad $U_{out}$ is connecting an emitter/anode node of high side device 202a corresponding to emitter/anode node 112a in FIG. 1. Although not shown in FIG. 2, common output pad $U_{out}$ is coupling the emitter/anode node of high side device 202a to a collector/cathode node of a low side device, which can correspond to collector/cathode node 114d of low side device 102d in FIG. 1.

Also shown in FIG. 2, high side gate pad $G_{H1}$ can correspond to high side gate terminal $G_{H1}$ in FIG. 1. High side gate pad $G_{H1}$ is electrically connected to gate 228a of high side device 202a. More particularly, high side gate pad $G_{H1}$ is electrically connected to gate 228a through a bottom surface of IGBT die 204a.

In FIG. 2, conductive clip 218a is connecting high side supply pads $V_{H1}$ and $V_{H2}$. More particularly, conductive clip 218a is electrically connected to high side supply pad $V_{H1}$ through leg 230a and conductive clip 218a is electrically connected to high side supply pad $V_{H2}$ through leg 230b. Thus, conductive clip 218a and high side supply pads $V_{H1}$ and $V_{H2}$ include current path 236 such that current can traverse through conductive clip 218a. In the present embodiment, current can traverse through conductive clip 218a over common output pad $U_{out}$, IGBT die 204a, diode die 206a, and high side gate electrode $G_{H1}$. As such, current path 236 can be routed in three-dimensions over substrate 216. Also in the present embodiment, conductive clip 218a causes current to traverse through conductive clip 218a to another high side conductive clip in another power module, which is not shown in FIG. 2, but is electrically connected to high side supply pad $V_{H2}$. By providing current path 236, the design and layout of a circuit, such as motor drive inverter 100, can be significantly simplified, even with many dies being connected over substrate 216.

In the present embodiment, high side device 202a implements IGBT 104a and diode 106a of FIG. 1 in respective separate dies (i.e. IGBT die 204a and diode die 206a). However, in some embodiments diode 106a is monolithically integrated with IGBT 104a on a single die. In one embodiment, diode die 106a is formed on the backside of the single die. The single die can be connected similar to IGBT die 204a and diode die 206a in FIG. 2. Furthermore, as described above, in some embodiments a MOSFET replaces IGBT 104a. Thus, high side device 202a can comprise the MOSFET in parallel with diode 106a. As such, in some embodiments, IGBT die 204a can be replaced with a MOSFET die connected similar to IGBT die 204a. In one embodiment, diode 106a can be a body diode of the MOSFET. In another embodiment, diode 106a is not a body diode, but is monolithically integrated with the MOSFET on a single die. The single die can be connected similar to IGBT die 204a and diode die 206a in FIG. 2.

Although FIG. 2 illustrates high side device 202a, corresponding to high side device 102a in FIG. 1, high side devices 102b and 102c are similar to high side device 102a and thus are not shown and described in FIG. 2 for brevity. Similarly, low side devices 102d, 102e, and 102f are not shown and described for brevity.

Figure 3B:
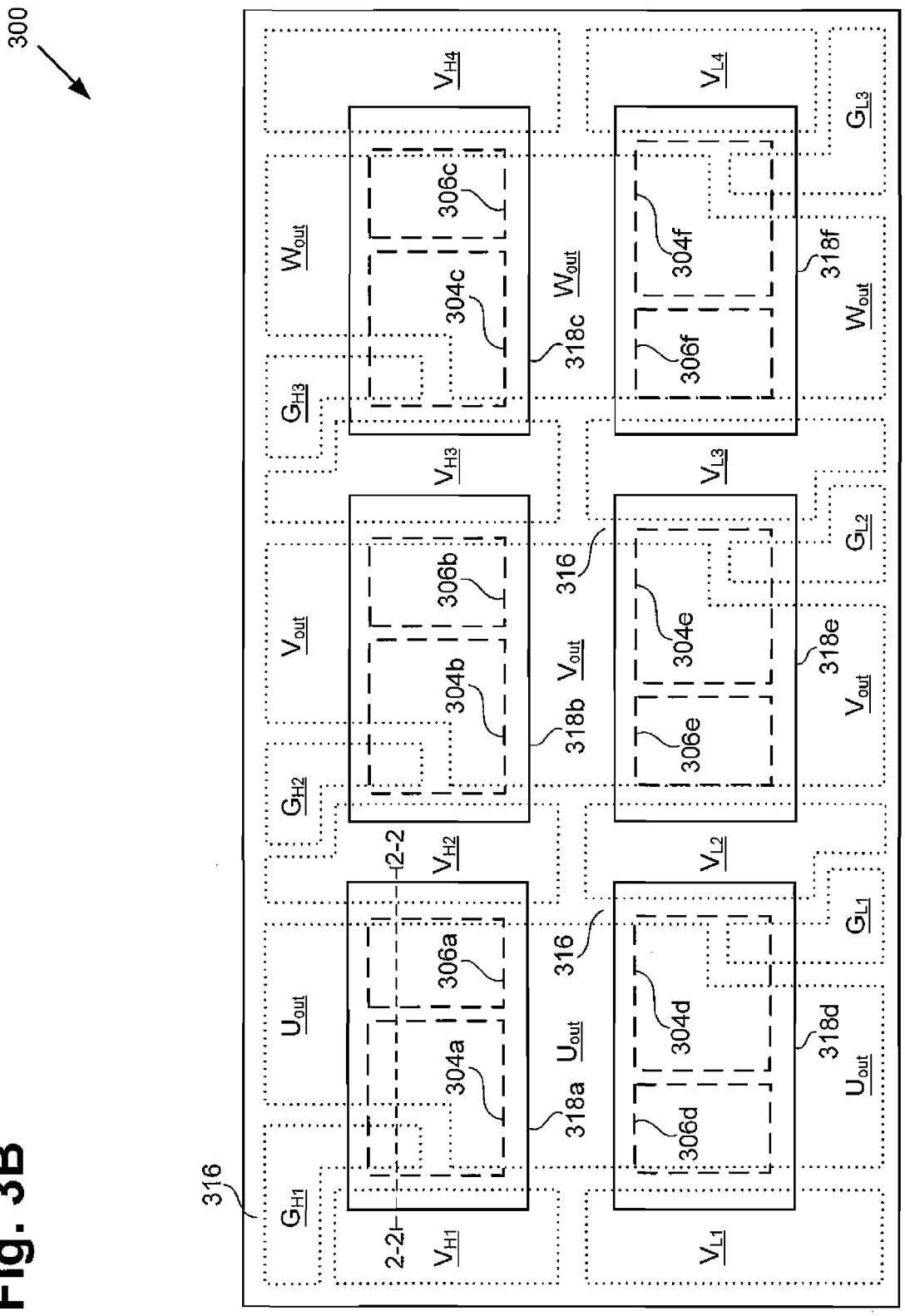
FIG. 3B shows a top view of a bondwireless three-phase motor drive power module, in accordance with an embodiment of the present invention.

Referring now to FIGS. 3A and 3B, FIGS. 3A and 3B show top views of bondwireless three-phase motor drive inverter module 300 (also referred to herein as a "motor drive inverter module" or a "three-phase motor drive power module" or the like), in accordance with an embodiment of the present invention. FIGS. 3A and 3B show substrate 316 corresponding to substrate 216 in FIG. 2. In FIG. 3A, high side devices 302a, 302b, and 302c and low side devices 302d, 302e, and 302f over substrate 316, correspond respectively to high side devices 102a, 102b, and 102c and low side devices 102d, 102e, and 102f in FIG. 1. Thus, in FIG. 3B, IGBT dies 304a, 304b, 304c, 304d, 304e, and 304f correspond respectively to IGBTs 104a, 104b, 104c, 104d, 104e, and 104f in FIG. 1 and diode dies 306a, 306b, 306c, 306d, 306e, and 306f correspond respectively to diodes 106a, 106b, 106c, 106d, 106e, and 106f in FIG. 1. As such, each of IGBT dies 304a, 304b, 304c, 304d, 304e, and 304f are connected in parallel with one of diode dies 306a, 306b, 306c, 306d, 306e, and 306f respectively.

In FIGS. 3A and 3B, three-phase motor drive inverter module 300 comprises a U-phase, a V-phase, and a W-phase. The U-phase comprises a power module including high side and low side devices 302a and 302d and conductive clips 318a and 318d. The V-phase comprises a power module including high side and low side devices 302b and 302e and conductive clips 318b and 318e. The W-phase comprises a power module including high side and low side devices 302c and 302f and conductive clips 318c and 318f. Although the present embodiment is a three-phase motor drive inverter module, other embodiments can include more or fewer phases. Furthermore, in some embodiments, power module 300 can comprise a circuit other than a motor drive inverter.

In FIGS. 3A and 3B, high side device 302a corresponds to high side device 202a in FIG. 2. More particularly, cross-section 2-2 in FIGS. 3A and 3B corresponds to the cross-sectional view shown in FIG. 2. Thus, high side conductive clip 318a corresponds to high side conductive clip 218a in FIG. 2. Furthermore, high side supply pads $V_{H1}$ and $V_{H2}$, high side gate pad $G_{H1}$, and common output pad $U_{out}$ correspond respectively to high side supply pads $V_{H1}$ and $V_{H2}$, high side gate pad $G_{H1}$, and common output pad $U_{out}$ in FIG. 2. Also, current path 336 corresponds to current path 236 in FIG. 2. It is noted that FIGS. 3A and 3B do not show features corresponding to insulating material 232 and conductive material 234 in FIG. 2, which are optional.

FIG. 3B shows a transparent top view of three-phase motor drive inverter module 300 to illustrate the layout of high side gate pads $G_{H1}$, $G_{H2}$ and $G_{H3}$, low side gate pads $G_{L1}$, $G_{L2}$ and $G_{L3}$, high side supply pads $V_{H1}$, $V_{H2}$, $V_{H3}$ and $V_{H4}$, low side supply pads $V_{L2}$, $V_{L3}$, and $V_{L4}$, and common output pads $U_{out}$, $V_{out}$ and $W_{out}$ on substrate 316. For example, high side supply pads $V_{H1}$ and $V_{H2}$ are each under and electrically connected to conductive clip 318a in regions shown as overlapping conductive clip 318a in FIG. 3B. In FIG. 2, these electrical connections are facilitated by legs 230a and 230b respectively.

FIG. 3B also shows IGBT die 304a and diode die 306a, which correspond to IGBT die 204a and diode die 206a in FIG. 2 and are under conductive clip 318a. High side gate pad $G_{H1}$ is under and electrically connected to IGBT die 302a in a region shown as overlapping IGBT die 302a in FIG. 3B. In FIG. 2, this electrical connection is shown to gate 228a and is through the bottom surface of IGBT die 204a. Similarly, common output pad $U_{out}$ is under and electrically connected to IGBT die 304a and diode die 306a in a region shown as overlapping IGBT die 302a and diode die 206a in FIG. 3B. In FIG. 2, these electrical connections are shown respectively to emitter 222a and anode 226a through the respective bottom surfaces of IGBT die 204a and diode die 206a.

In the present embodiment, high side device 302b is similar to high side device 302a. For example, high side device 302b is connected to high side gate pad $G_{H2}$, high side supply pads $V_{H2}$ and $V_{H3}$, and common output pad $V_{out}$ in a similar manner as shown and described with respect to high side device 302a being connected respectively to high side gate pad $G_{H1}$, high side supply pads $V_{H1}$ and $V_{H2}$, and common output pad $U_{out}$ in FIGS. 2, 3A and 3B. Thus, for example, conductive clip 318a is electrically connected to conductive clip 318b through high side supply pad $V_{H2}$. Furthermore, conductive clip 318b causes current to traverse through conductive clip 318b over common output pad $V_{out}$.

Also, high side device 302c is similar to high side devices 302a and 302b. For example, high side device 302c is connected to high side gate pad $G_{H3}$, high side supply pads $V_{H3}$ and $V_{H4}$, and common output pad $W_{out}$ in a similar manner as shown and described with respect to high side device 302a being connected respectively to high side gate pad $G_{H1}$, high side supply pads $V_{H1}$ and $V_{H2}$, and common output pad $U_{out}$ in FIGS. 2, 3A and 3B. Thus, for example, conductive clip 318b is electrically connected to conductive clip 318c through high side supply pad $V_{H3}$. Furthermore, conductive clip 318c causes current to traverse through conductive clip 318c over common output pad $W_{out}$.

Also in the present embodiment, low side device 302d is connected to low side gate pad $G_{L1}$, low side supply pads $V_{L1}$ and $V_{L2}$, and common output pad $U_{out}$ in a similar manner as described with respect to high side device 302a being connected respectively to high side gate pad $G_{H1}$, high side supply pads $V_{H1}$ and $V_{H2}$, and common output pad $U_{out}$ in FIGS. 2, 3A and 3B. Thus, conductive clip 318d causes current to traverse through conductive clip 318d over common output pad $U_{out}$. However, with respect to low side device 302d, common output pad $U_{out}$ is electrically connected to a collector/cathode node of low side device 302d rather than an emitter/anode node as described with respect to high side device 302a. The collector/cathode node corresponds to collector/cathode node 114d in FIG. 1. Also, conductive clip 318d is connecting an emitter of low side device 302d to an anode of low side device 302d as opposed to conductive clip 318a, which is connecting a collector of high side device 302a to a cathode of high side device 302a. In some embodiments, the above described connections can be achieved by connecting common output pad $U_{out}$ to a collector and a cathode of low side device 302d through a respective bottom surface of IGBT die 304d and diode die 306d and connecting conductive clip 318d to an emitter and an anode of low side device 302d through a respective top surface of IGBT die 304d and diode die 306d. Thus, common output pad $U_{out}$ is coupling an emitter/anode node of high side device 302a to a collector/cathode node of low side device 302d and is under both high side and low side conductive clips 318a and 318d.

Furthermore, in the present embodiment, low side devices 302e and 302f are each similar to low side device 302d. For example, low side device 302e is connected to low side gate pad $G_{L2}$, low side supply pads $V_{L2}$ and $V_{L3}$, and common output pad $V_{out}$ in a similar manner as described with respect to low side device 302d being connected respectively to low side gate pad $G_{L1}$, low side supply pads $V_{L1}$ and $V_{L2}$, and common output pad $U_{out}$. Thus, for example, conductive clip 318d is electrically connected to conductive clip 318e through low side supply pad $V_{L2}$. Furthermore, conductive clip 318e causes current to traverse through conductive clip 318e over common output pad $V_{out}$.

Also, low side device 302f is connected to low side gate pad $G_{L3}$, low side supply pads $V_{L3}$ and $V_{L4}$, and common output pad $W_{out}$ in a similar manner as described with respect to low side device 302d being connected respectively to low side gate pad $G_{L1}$, low side supply pads $V_{L1}$ and $V_{L2}$, and common output pad $U_{out}$. Thus, for example, conductive clip 318e is electrically connected to conductive clip 318f through low side supply pad $V_{L3}$. Furthermore, conductive clip 318f causes current to traverse through conductive clip 318f over common output pad $W_{out}$.

Common output pads $U_{out}$, $V_{out}$, and $W_{out}$ can correspond respectively to output terminals $U_{out}$, $V_{out}$, and $W_{out}$ in FIG. 1. Thus, in three-phase motor drive inverter module 300, common output pad $U_{out}$ is coupling an emitter/anode node of high side device 302a to a collector/cathode node of low side device 302d. The emitter/anode node can correspond to emitter/anode node 112a and the collector/cathode node can correspond to collector/cathode node 114d in FIG. 1. Also, common output pad $V_{out}$ is coupling an emitter/anode node of high side device 302b to a collector/cathode node of low side device 302e. The emitter/anode node can correspond to emitter/anode node 112c and the collector/cathode node can correspond to collector/cathode node 114e in FIG. 1. Furthermore, common output pad $W_{out}$ is coupling an emitter/anode node of high side device 302c to a collector/cathode node of low side device 302f. The emitter/anode node can correspond to emitter/anode node 112c and the collector/cathode node can correspond to collector/cathode node 114f in FIG. 1. In the present embodiment, each of common output pads $U_{out}$, $V_{out}$, and $W_{out}$ are contiguous pads over substrate 316 and in some embodiments can be respective contiguous pads of a direct bonded copper (DBC) substrate.

Also in the present embodiment, high side conductive clip 318a is connecting a collector of high side device 302a to a cathode of high side device 302a, and causing current to traverse through high side conductive clip 318a to high side conductive clip 318b in another power module comprising high side device 302b and low side device 302e. Similarly, high side conductive clip 318b is connecting a collector of high side device 302b to a cathode of high side device 302b, and causing current to traverse through high side conductive clip 318b to high side conductive clip 318c in another power module comprising high side device 302c and low side device 302f. Thus, current path 336 can extend from high side supply pad $V_{H1}$ to high side supply pad $V_{H4}$, which can correspond respectively to high side supply terminals $V_{H1}$ and $V_{H4}$ of high side supply bus 108 in FIG. 1. As such, each of high side conductive clips 302a, 302b, and 302c can be part of a high side supply bus having a wide current path with low inductance.

Also in three-phase motor drive inverter module 300, low side conductive clip 318d is connecting an emitter of low side device 318d to an anode of low side device 318d, and causing current to traverse through low side conductive clip 318d to low side conductive clip 318e in the another power module comprising high side device 302b and low side device 302e. Furthermore, low side conductive clip 318e is connecting an emitter of low side device 318e to an anode of low side device 318e, and causing current to traverse through low side conductive clip 318e to low side conductive clip 318f in the another power module comprising high side device 302c and low side device 302f. Thus, current path 338 can extend from low side supply pad $V_{L1}$ to low side supply pad $V_{L4}$, which can correspond respectively to low side supply terminals $V_{L1}$ and $V_{L4}$ of low side supply bus 110 in FIG. 1. As such, each of low side conductive clips 302d, 302e, and 302F can be part of a high side supply bus a wide current path with low inductance.

Thus, devices 302a and 302d can be connected in a half-bridge between high side and low side supply buses as a U-Phase of three-phase motor drive inverter module 300. Also, devices 302b and 302e can be connected in a half-bridge between high side and low side supply buses as a V-Phase of three-phase motor drive inverter module 300. Furthermore, devices 302c and 302f can be connected in a half-bridge between high side and low side supply buses as a W-Phase of three-phase motor drive inverter module 300.

Thus, as discussed above, in the embodiments of FIGS. 1 through 3B, the present invention can provide for a bondwireless power module, such as a bondwireless three-phase motor drive inverter module. Various embodiments of the present invention include a high side conductive clip connecting a collector of a high side device to a cathode of a high side device and a low side conductive clip connecting an emitter of a low side device to an anode of a low side device. As illustrated above, the high side and low side conductive clips can each cause current to traverse, in a three-dimensional manner, to another respective high side and low side conductive clip in another power module. For example, current can traverse over a common output pad of the power module. Thus, the power module can be formed without bond wires and can be significantly simplified, even with many dies being connected and with numerous connections to and between the dies. Furthermore, conductive pads can be used to provide current paths that are wide, symmetrical, and have low inductivity. Thus, the power module can have high performance as well as a small footprint and high power density.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A bondwireless power module comprising:
    a common output pad coupling an emitter/anode node of a high side device to a collector/cathode node of a low side device;
    a high side conductive clip connecting a collector of said high side device to a cathode of said high side device, and causing current to traverse through said high side conductive clip to another high side conductive clip in another power module;
    a low side conductive clip connecting an emitter of said low side device to an anode of said low side device, and causing current to traverse through said low side conductive clip to another low side conductive clip in said another power module.

2. The bondwireless power module of claim 1, wherein said bondwireless power module is a motor drive inverter module.

3. The bondwireless power module of claim 1, wherein said high side device comprises an IGBT in parallel with a diode.

4. The bondwireless power module of claim 1, wherein said low side device comprises an IGBT in parallel with a diode.

5. The bondwireless power module of claim 1, wherein said common output pad is situated under said high side and low side conductive clips.

6. The bondwireless power module of claim 1, wherein said high side conductive clip is part of a high side supply bus.

7. The bondwireless power module of claim 1, wherein said high side conductive clip causes current to traverse through said high side conductive clip and over said common output pad.

8. The bondwireless power module of claim 1, wherein said common output pad is situated on a direct bonded copper (DBC) substrate.

9. The bondwireless power module of claim 1, wherein said low side conductive clip causes current to traverse through said low side conductive clip and over said common output pad.

10. The bondwireless power module of claim 1, wherein said high side device and said low side device are connected in a half-bridge between a high side supply bus and a low side supply bus.

11. The bondwireless power module of claim 1, wherein said high side conductive clip is connected to said another high side conductive clip through a high side supply pad.

12. A bondwireless three-phase motor drive inverter module comprising:
   a U-phase, a V-phase, and a W-phase each including a respective common output pad coupling an emitter/anode node of a high side device to a collector/cathode node of a low side device, a high side conductive clip connecting a collector of said high side device to a cathode of said high side device, and a low side conductive clip connecting an emitter of said low side device to an anode of said low side device;
   said high side conductive clip of said U-phase causing current to traverse through said high side conductive clip of said U-phase to said high side conductive clip of said V-phase;
   said low side conductive clip of said U-phase causing current to traverse through said low side conductive clip of said U-phase to said low side conductive clip of said V-phase.

13. The bondwireless three-phase motor drive inverter module of claim 12, wherein said high side conductive clip of said V-phase causes current to traverse through said high side conductive clip of said V-phase to said high side conductive clip of said W-phase.

14. The bondwireless three-phase motor drive inverter module of claim 12, wherein said low side conductive clip of said V-phase causes current to traverse through said low side conductive clip of said V-phase to said low side conductive clip of said W-phase.

15. The bondwireless three-phase motor drive inverter module of claim 12, wherein said high side device comprises an IGBT in parallel with a diode.

16. The bondwireless three-phase motor drive inverter module of claim 12, wherein said low side device comprises an IGBT in parallel with a diode.

17. The bondwireless three-phase motor drive inverter module of claim 12, wherein said high side device comprises a IGBT in parallel with a diode, said diode being monolithically integrated with said IGBT on a single die.

18. The bondwireless three-phase motor drive inverter module of claim 12, wherein said high side device comprises a IGBT in parallel with a diode, said diode being monolithically integrated with said IGBT on a single die and formed on a backside of said single die.

19. The bondwireless three-phase motor drive inverter module of claim 12, wherein said high side device comprises a MOSFET in parallel with a diode, said diode being monolithically integrated with said MOSFET on a single die.

20. The bondwireless three-phase motor drive inverter module of claim 12, wherein said high side device comprises a MOSFET in parallel with a diode, said diode being a body diode of said MOSFET.

21. The bondwireless three-phase motor drive inverter module of claim 12, wherein said high side conductive clip is part of a high side supply bus.

22. The bondwireless three-phase motor drive inverter module of claim 12, wherein said low side conductive clip is part of a low side supply bus.

23. The bondwireless three-phase motor drive inverter module of claim 12, wherein said high side conductive clip causes current to traverse through said high side conductive clip and over said common output pad.

24. The bondwireless three-phase motor drive inverter module of claim 12, wherein said low side conductive clip causes current to traverse through said low side conductive clip and over said common output pad.

* * * * *